United States Patent [19]

Ryou

[11] Patent Number: 5,492,851
[45] Date of Patent: Feb. 20, 1996

[54] METHOD FOR FABRICATING ATTACHED CAPACITOR CELLS IN A SEMICONDUCTOR DEVICE HAVING A THIN FILM TRANSISTOR

[75] Inventor: Eui K. Ryou, Bubaleub, Rep. of Korea

[73] Assignee: Hyundai Electronics Industries Co., Ltd., Rep. of Korea

[21] Appl. No.: 406,673

[22] Filed: Mar. 20, 1995

[30]  Foreign Application Priority Data

Mar. 18, 1994 [KR] Rep. of Korea ................... 1994-5503

[51] Int. Cl.⁶ .......................... H01L 21/70; H01L 27/00
[52] U.S. Cl. .............. 437/52; 437/60; 437/915; 437/919
[58] Field of Search ................. 437/47–48, 52, 437/60, 919, 915

[56]  References Cited

U.S. PATENT DOCUMENTS

| | | | |
|---|---|---|---|
| 5,122,476 | 6/1992 | Fazan et al. | 437/52 |
| 5,296,402 | 3/1994 | Ryou | 437/60 |

Primary Examiner—Olik Chaudhuri
Assistant Examiner—H. Jey Tsai
Attorney, Agent, or Firm—Merchant, Gould, Smith, Edell, Welter & Schmidt

[57]  ABSTRACT

A method for fabricating a semiconductor device, capable of simplifying the fabrication, increasing the effective surface area of a charge storage electrode on a limited area, and thereby achieving the fabrication of a highly integrated semiconductor device. The method includes the steps of forming a bulk metal oxide silicon field effect transistor having a first element isolation layer, a first gate and first source and drain on a semiconductor substrate, sequentially forming an insulating layer, a planarizing layer, a capacitor and a first bit line electrode layer being in contact with the first source and drain over the bulk transistor, forming a planarizing layer over the entire exposed surface of the resulting structure and then a semiconductor layer for a substrate of a thin film transistor to be formed, forming a thin film metal oxide silicon field effect transistor having a second gate and second source and drain on the semiconductor layer, and forming a second bit line electrode layer on the resulting structure such that the second bit line electrode layer is in contact with the first bit line electrode layer as well as the second source and drain.

5 Claims, 16 Drawing Sheets

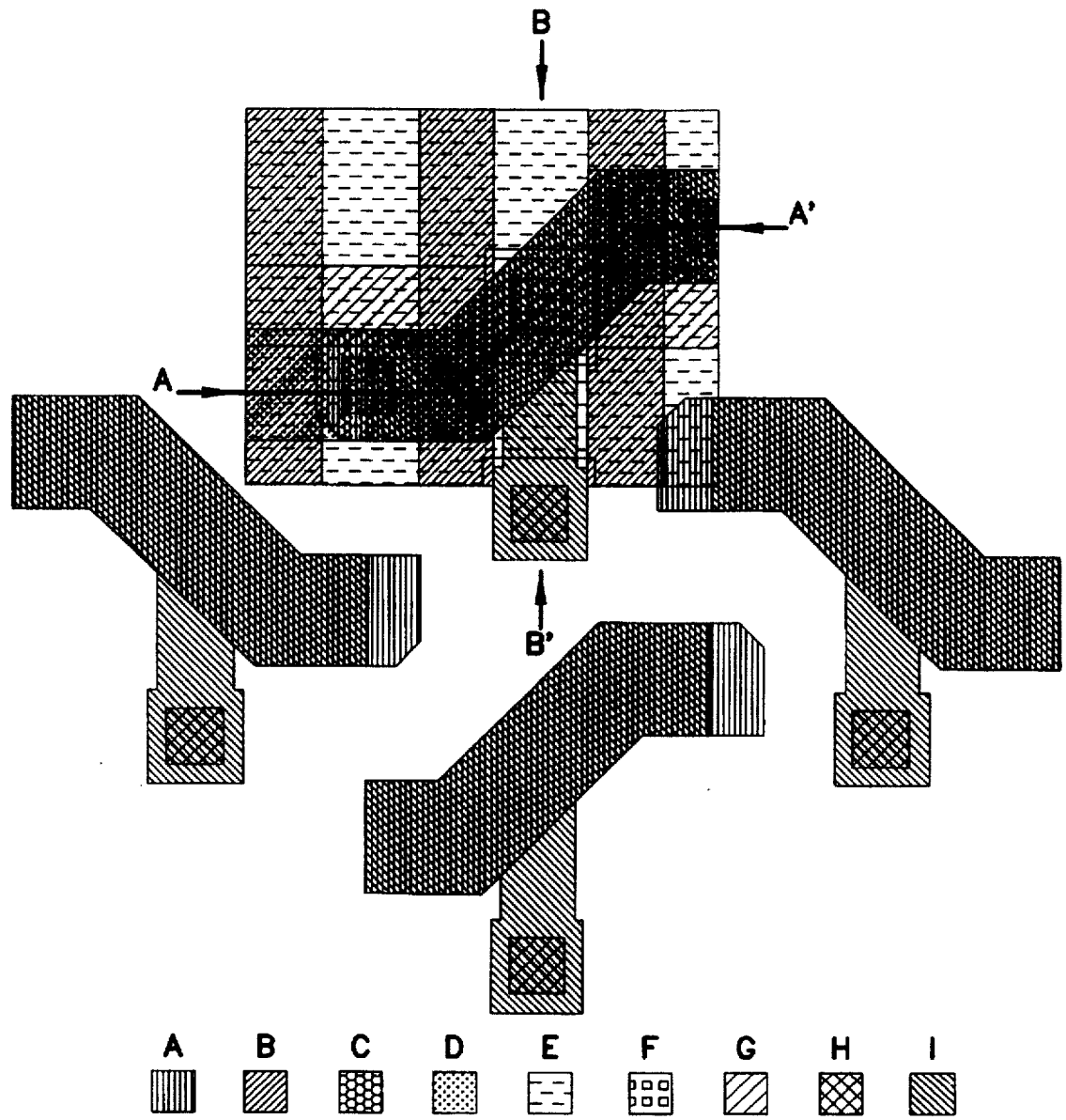
FIG. 1 A-I

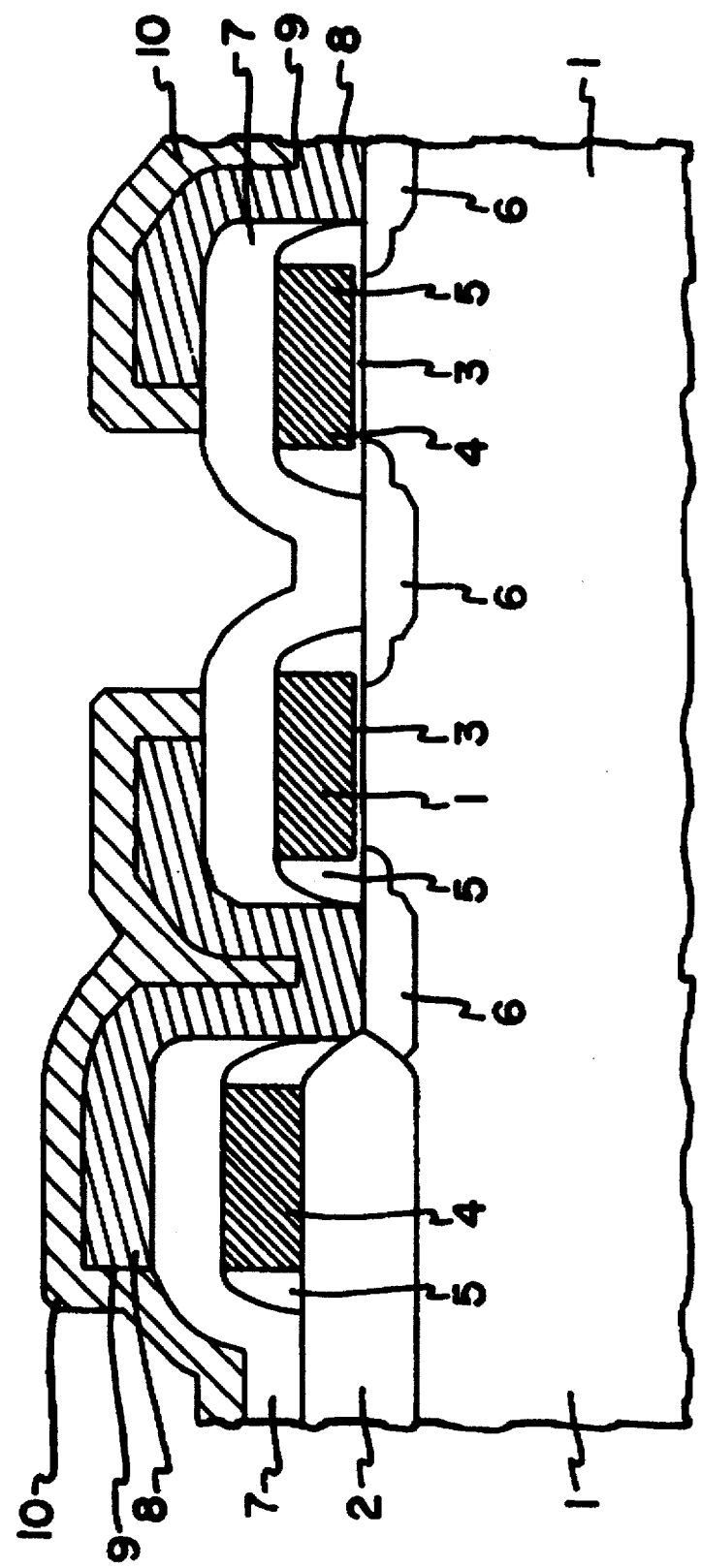

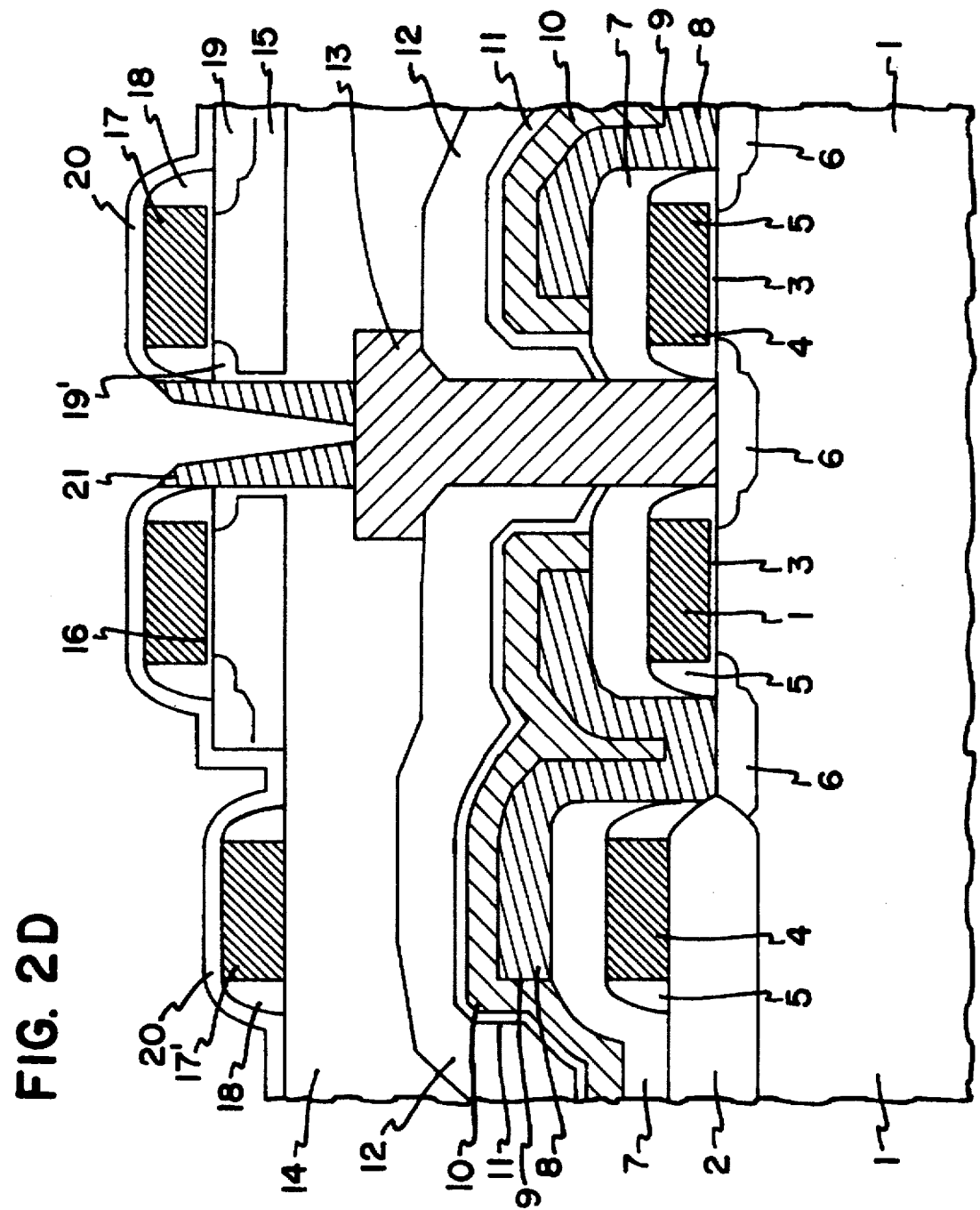

METHOD FOR FABRICATING ATTACHED CAPACITOR CELLS IN A SEMICONDUCTOR DEVICE HAVING A THIN FILM TRANSISTOR

BACKGROUND OF THE INVENTION

1. Field of the Invention

The present invention relates to a method for fabricating a semiconductor device, and more particularly to a method for fabricating a semiconductor device with an increased integration degree.

2. Description of the Prior Art

As semiconductor memory devices such as dynamic random access memories (DRAMs) have an increased integration degree, the area of cell thereof is inevitably reduced. Such a reduction in cell area results in a limitation on charge storage capacity. Since the unit area of chip and cell is inevitably reduced for realization of high integration of a semiconductor integrated circuit, it is necessary to achieve the reliability of a semiconductor device, to obtain a sufficient charge storage capacity of the cell and develop a sophisticated technique for fabrication of the semiconductor device.

For easy understanding the present invention, a conventional method for forming a charge storage electrode will be described in brief.

In accordance with the conventional method, a field oxide film is first formed over a semiconductor substrate. Thereafter, growth of a gate oxide film is carried out. Over the resulting structure, a polysilicon film is then deposited. Following the deposition of the polysilicon film, an impurity implantation is carried out to form a gate electrode and a word line pattern. Subsequently, formation of a metal oxide silicon field effect transistor (MOSFET) is carried out. The MOSFET has an active region formed with a lightly doped drain (LDD) structure by use-of a spacer oxide film in order to improve an electrical characteristic thereof. Over the entire exposed surface of the resulting structure, an insulating oxide film is then deposited to a predetermined thickness. The insulating oxide film is selectively etched so that a contact hole is formed at the active region of the MOSFET. Thereafter, a doped polysilicon layer for a charge storage electrode is deposited in the contact hole such that it is in contact with the active region of the MOSFET. Using a mask, formation of the charge storage electrode having a predetermined dimension is carried out. Subsequently, a dielectric film is grown over the storage electrode. The dielectric film has a composite structure such as a nitride-oxide (NO) composite structure or an oxide-nitride-oxide (ONO) composite structure. Over the entire exposed surface of the resulting structure, a doped polysilicon layer is then formed. The polysilicon layer is patterned to form a plate electrode. Thus, a memory device is fabricated.

When the existing process capability is taken into consideration, the above-mentioned conventional method encounters a limitation on charge storage capacity caused by the reduction in area of chip and cell upon fabricating a semiconductor device with a higher integration degree, in spite of development of highly sophisticated techniques for fabrication of the semiconductor device.

SUMMARY OF THE INVENTION

Therefore, an object of the invention is to provide a method for fabricating a semiconductor device, capable of simplifying the fabrication, increasing the effective surface area of a charge storage electrode on a limited area, and thereby achieving the fabrication of a highly integrated semiconductor device.

In accordance with the present invention, this object can be accomplished by providing a method for fabricating a semiconductor device, comprising the steps of: (a) forming a bulk metal oxide silicon field effect transistor having a first element isolation layer, a first gate and first source and drain on a semiconductor substrate; (b) sequentially forming an insulating layer, a planarizing layer, a capacitor and a first bit line electrode layer being in contact with the first source and drain over the bulk transistor; (c) forming a planarizing layer over the entire exposed surface of the resulting structure obtained at the step (b) and then forming a semiconductor layer for a substrate of a thin film transistor to be formed; (d) forming the thin film metal oxide silicon field effect transistor having a second gate and second source and drain on the semiconductor layer; and (e) forming a second bit line electrode layer on the resulting structure obtained at the step (d) such that the second bit line electrode layer is in contact with the first bit line electrode layer as well as the second source and drain.

BRIEF DESCRIPTION OF THE DRAWINGS

Other objects and aspects of the invention will become apparent from the following description of embodiments with reference to the accompanying drawings in which:

FIGS. 1A to 1I are plan views illustrating a layout of each particular mask depicted in composite in FIG. 1 A–I;

FIGS. 2A to 2E are cross-sectional views taken along the line A—A' of FIG. 1A–I, respectively illustrating processing steps in accordance with the present invention.

DETAILED DESCRIPTION OF THE PREFERRED EMBODIMENTS

Figure 1A:
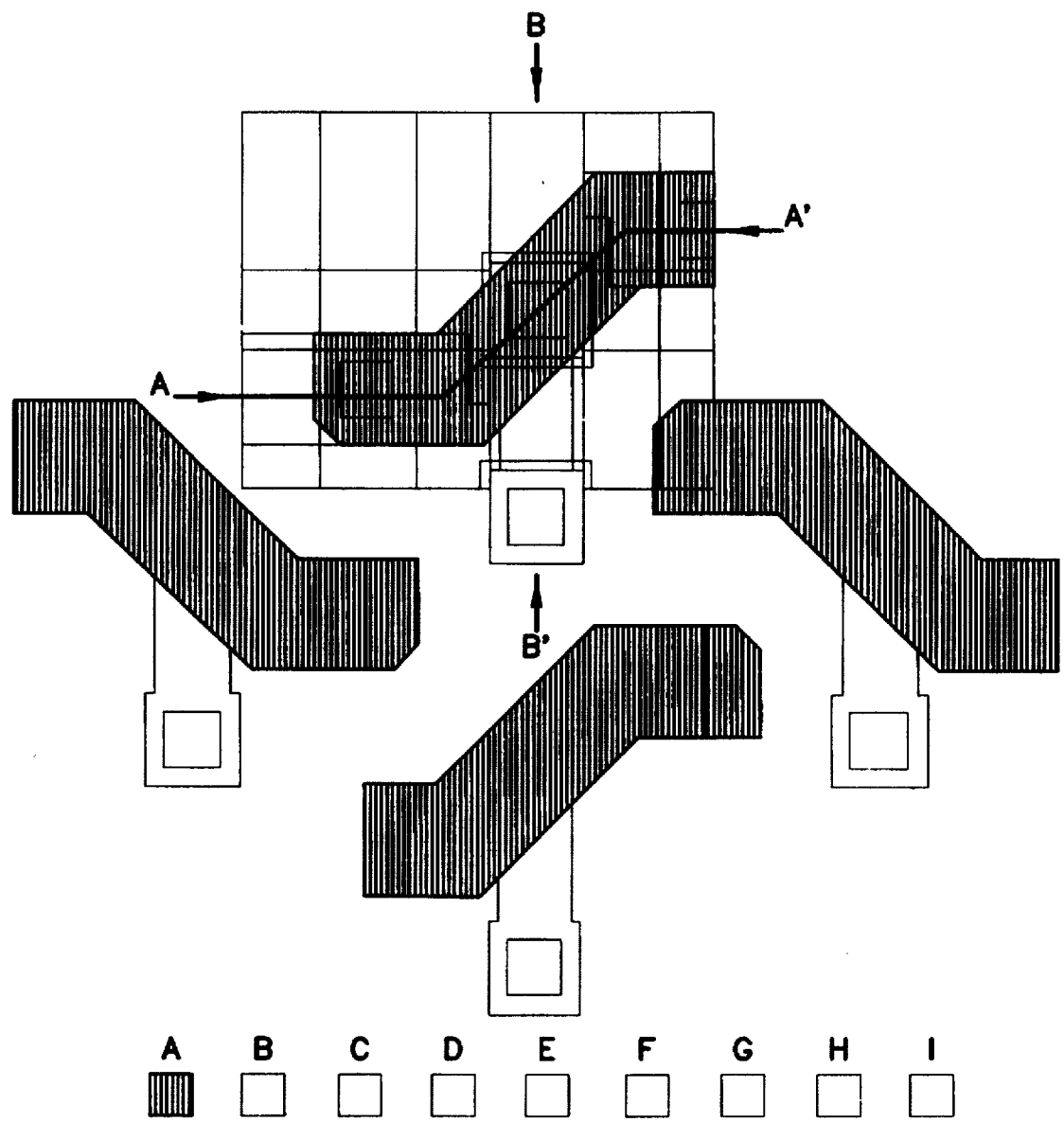
FIG. 1A–I is a plan view illustrating a layout of masks employed for fabrication of a semiconductor device in accordance with the present invention.
Figure 1B:
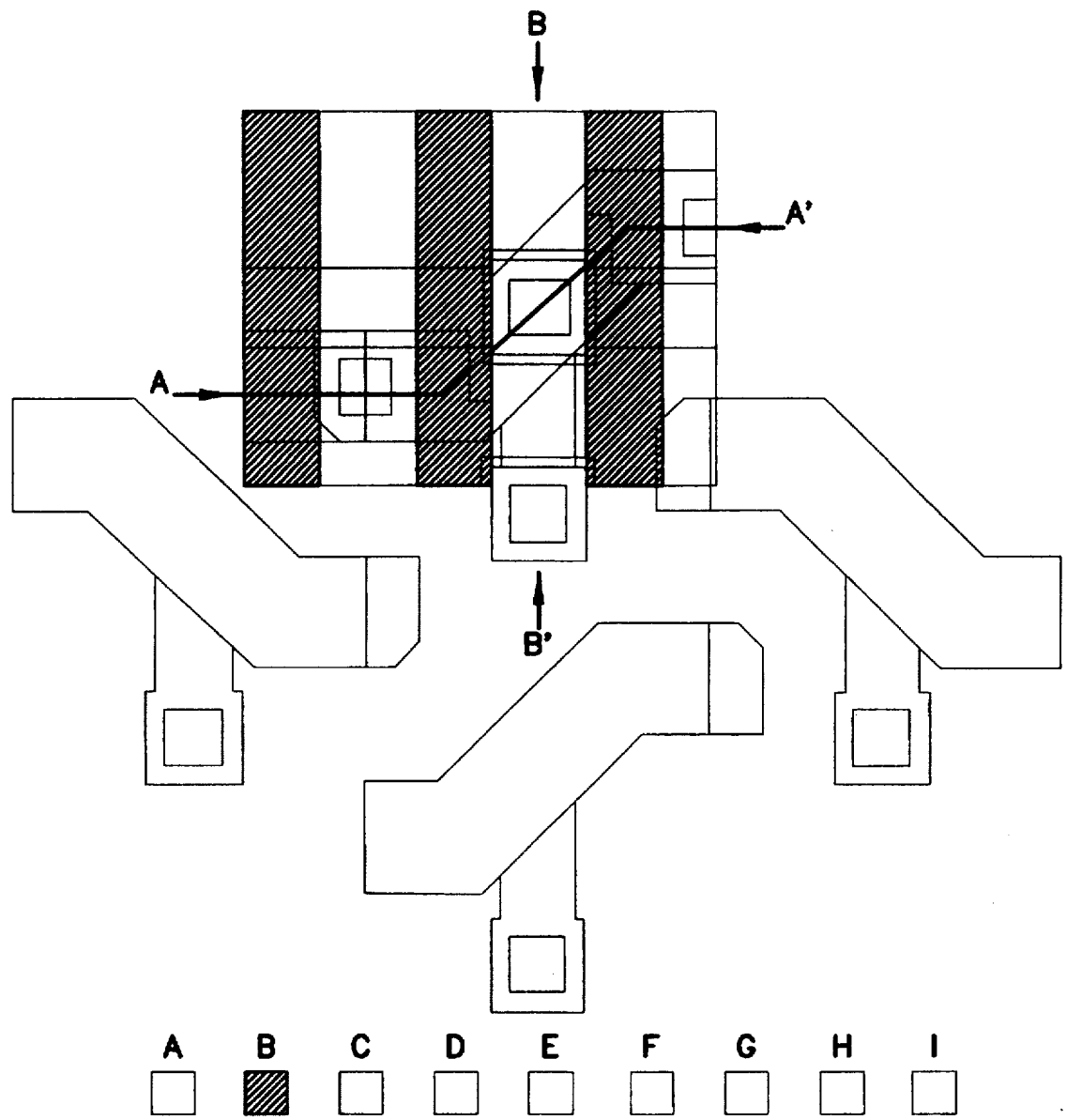
Figure 1C:
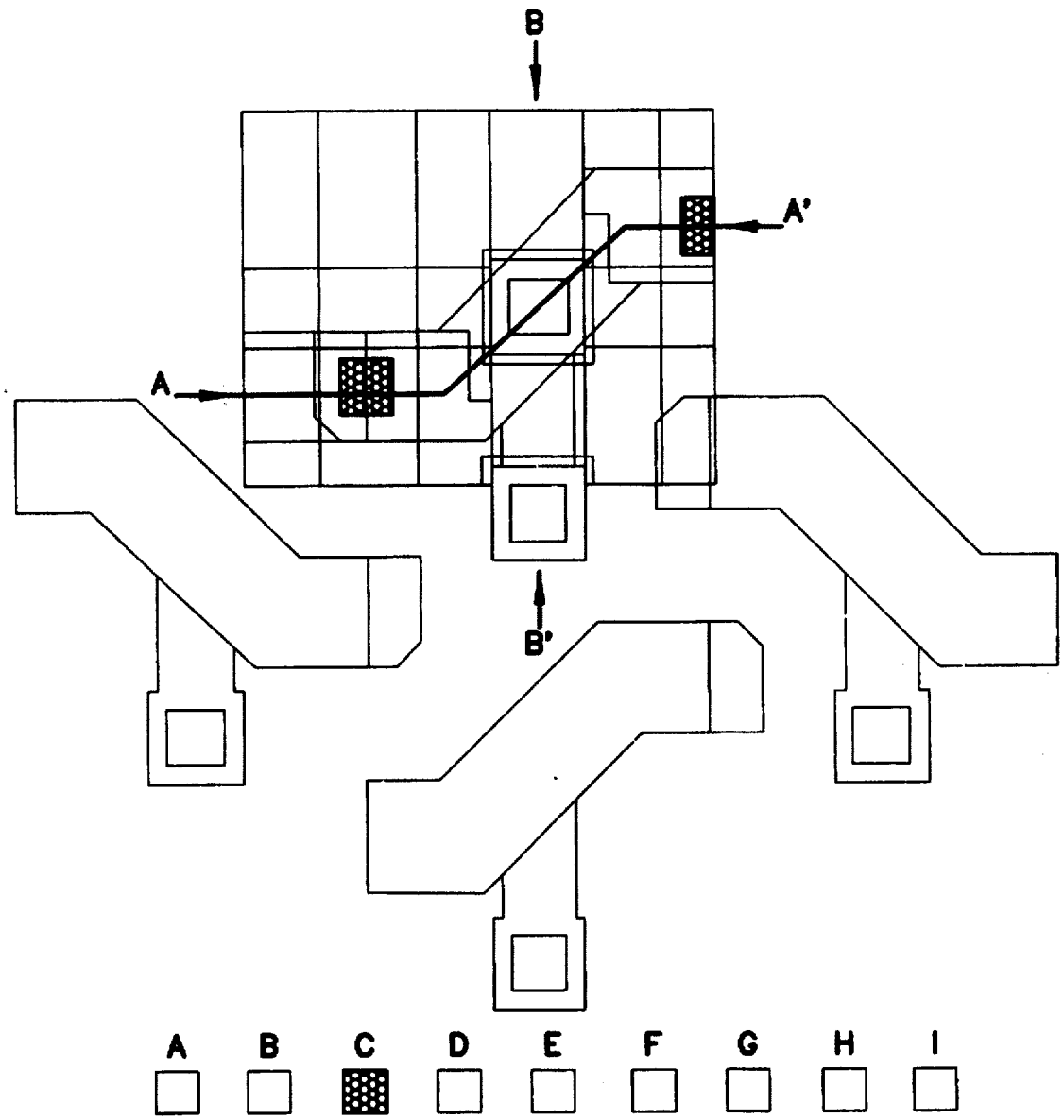
Figure 1D:
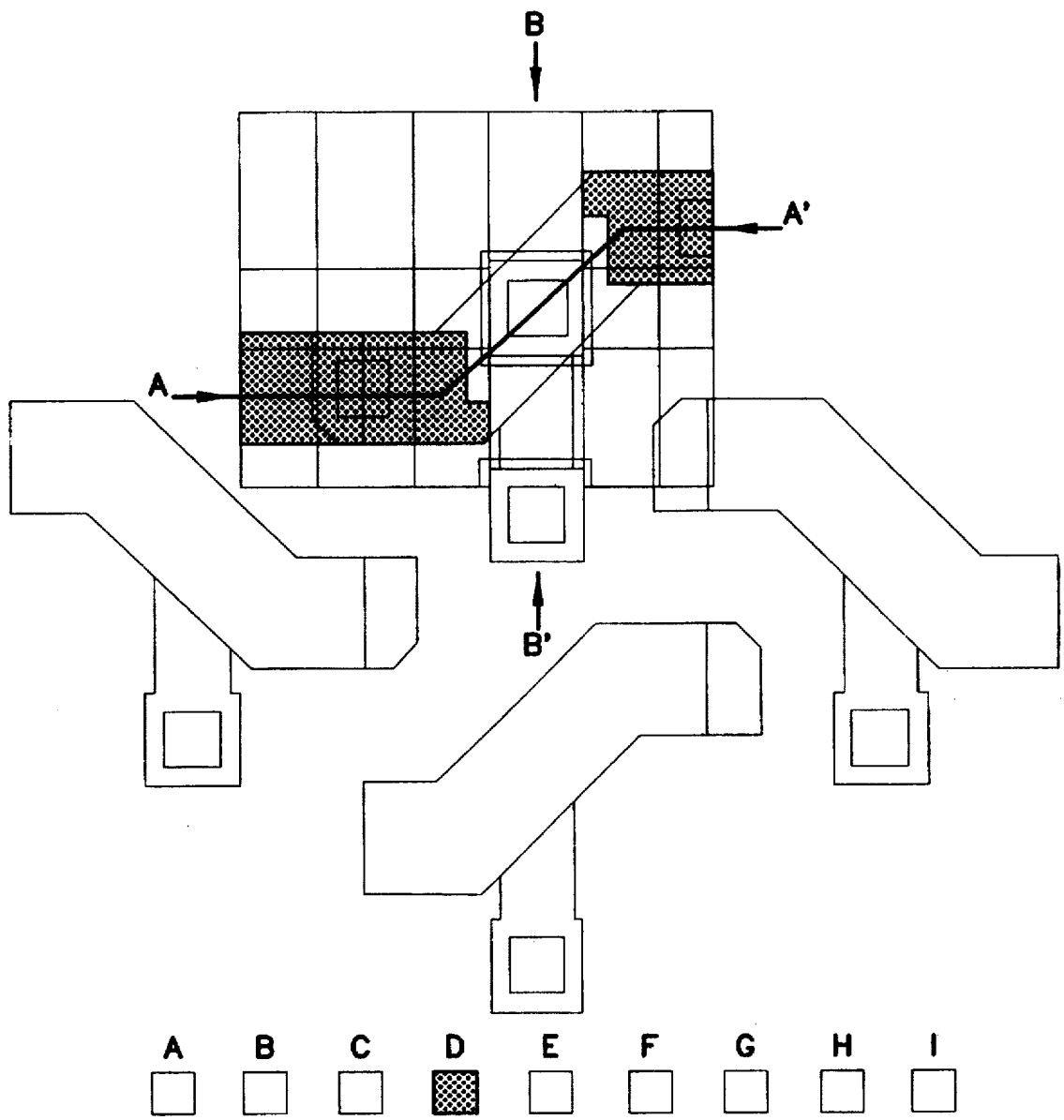
Figure 1E:
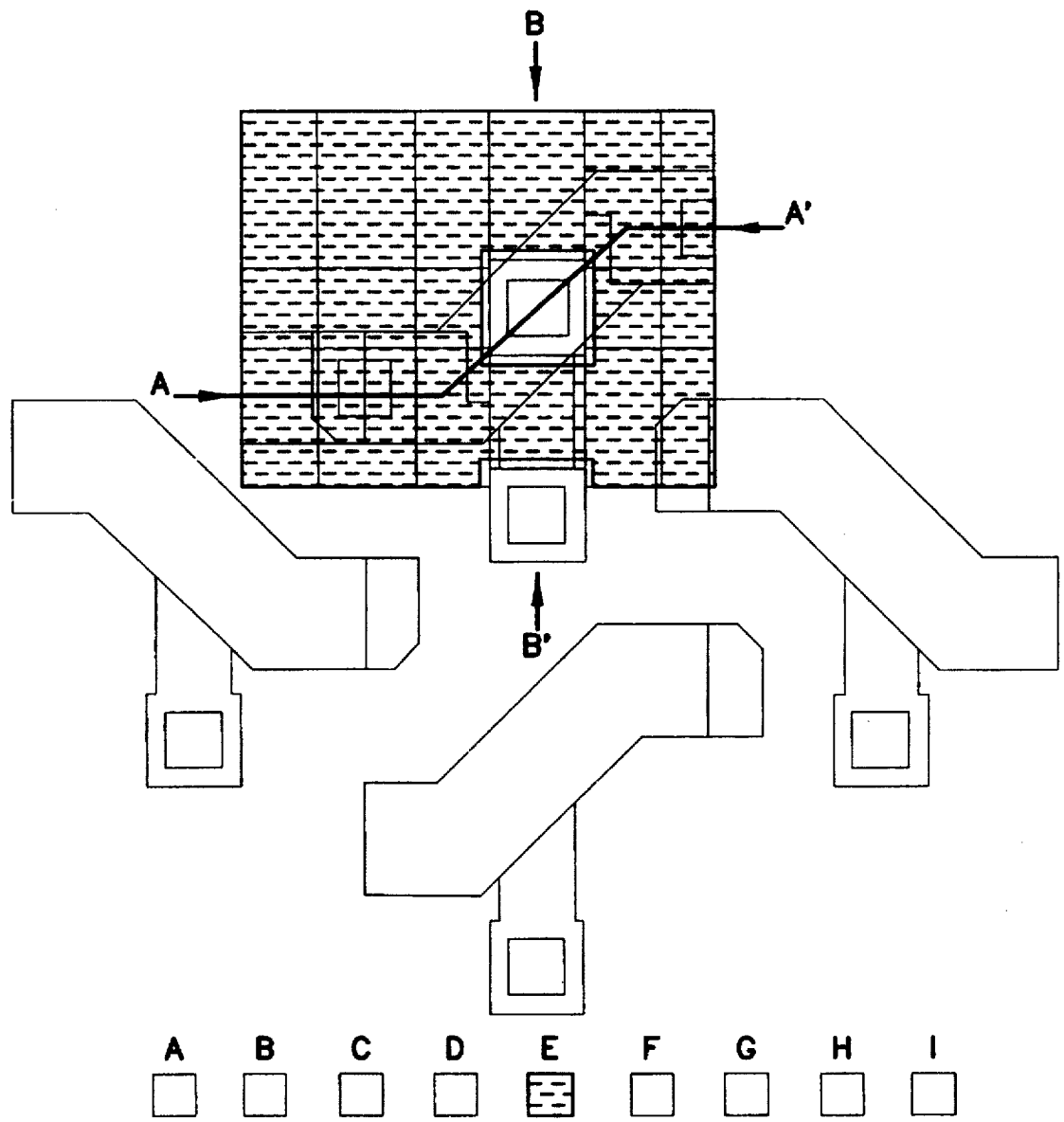
Figure 1F:
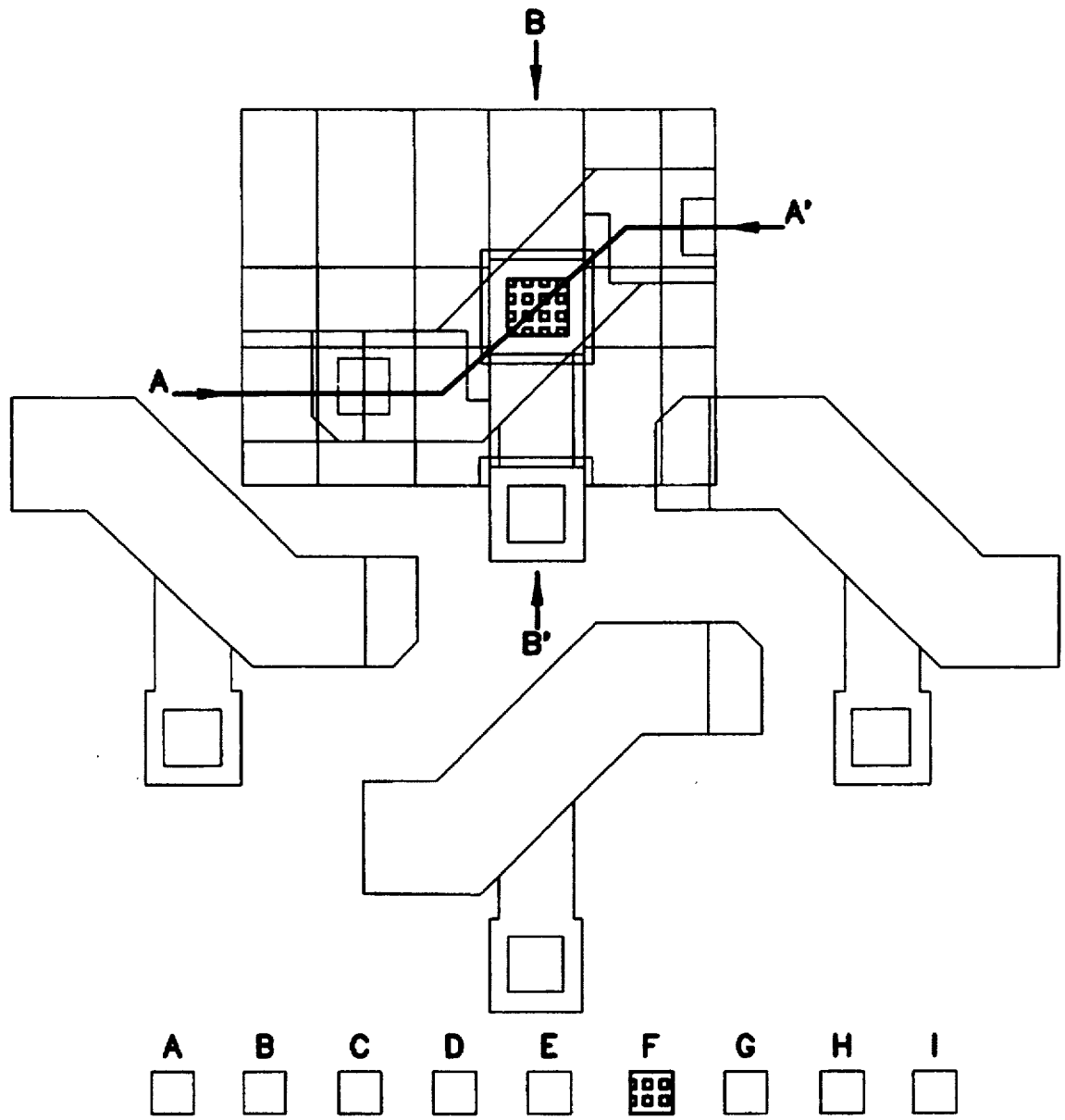
Figure 1G:
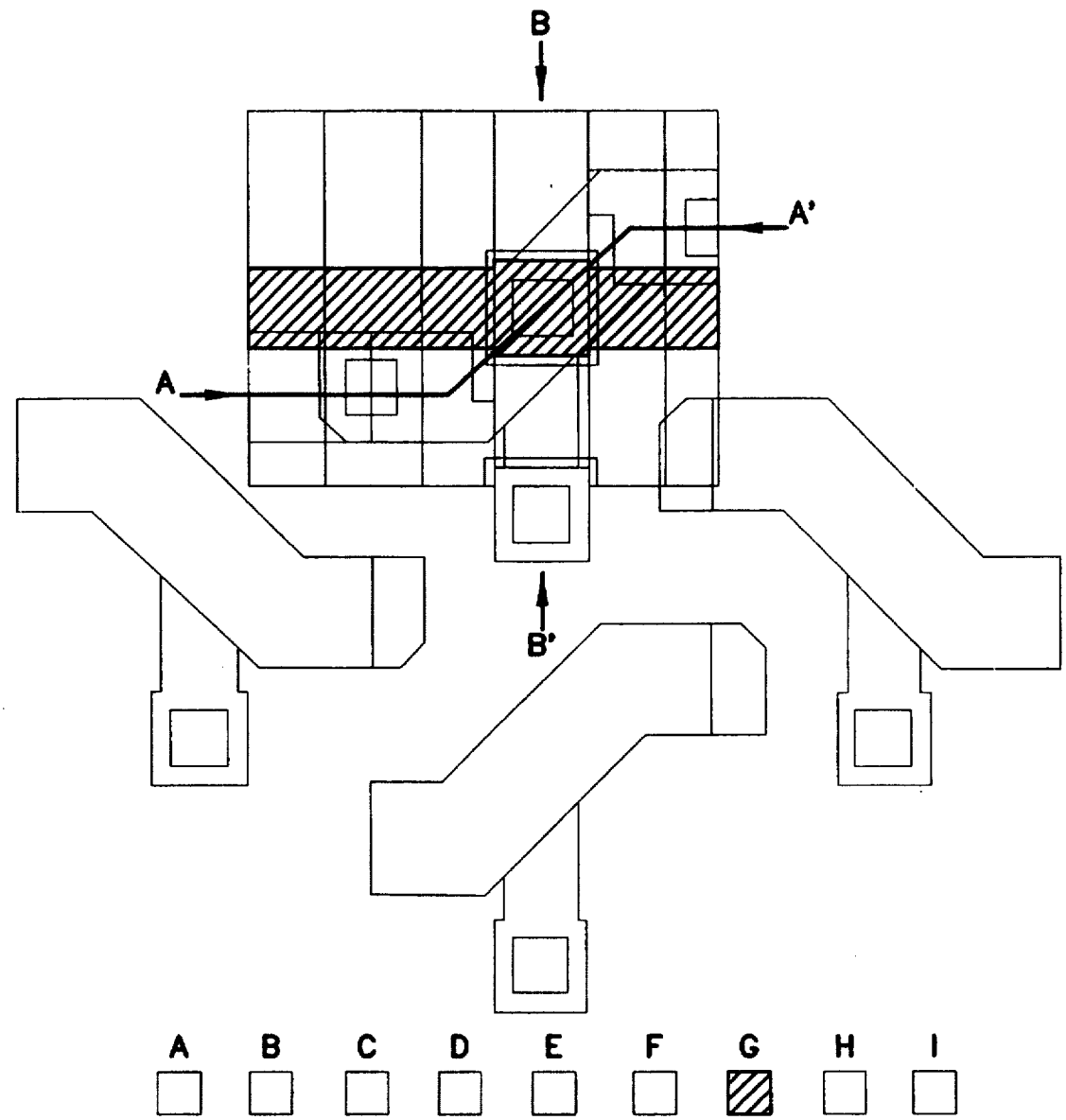
Figure 1H:
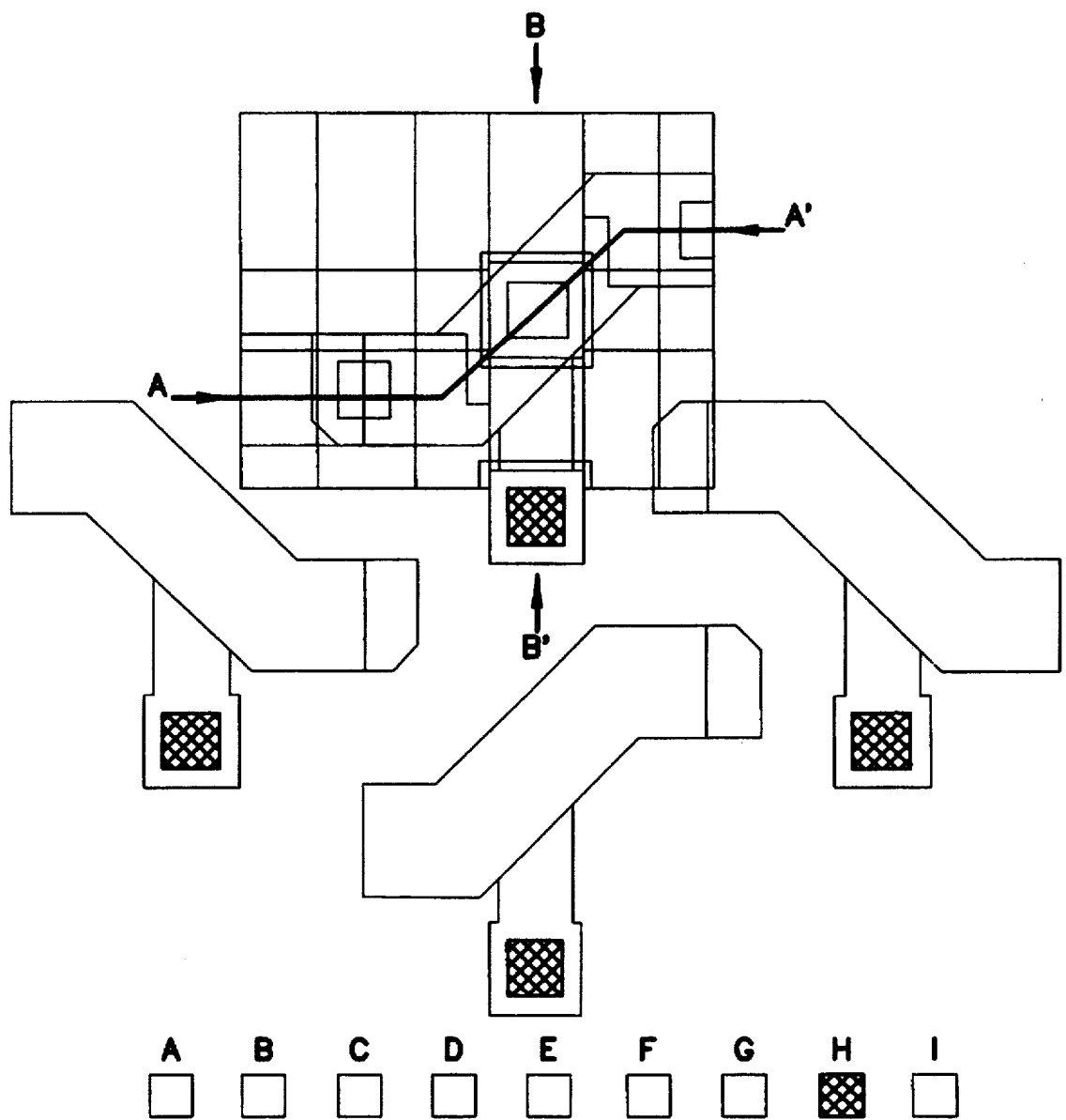
Figure 1I:
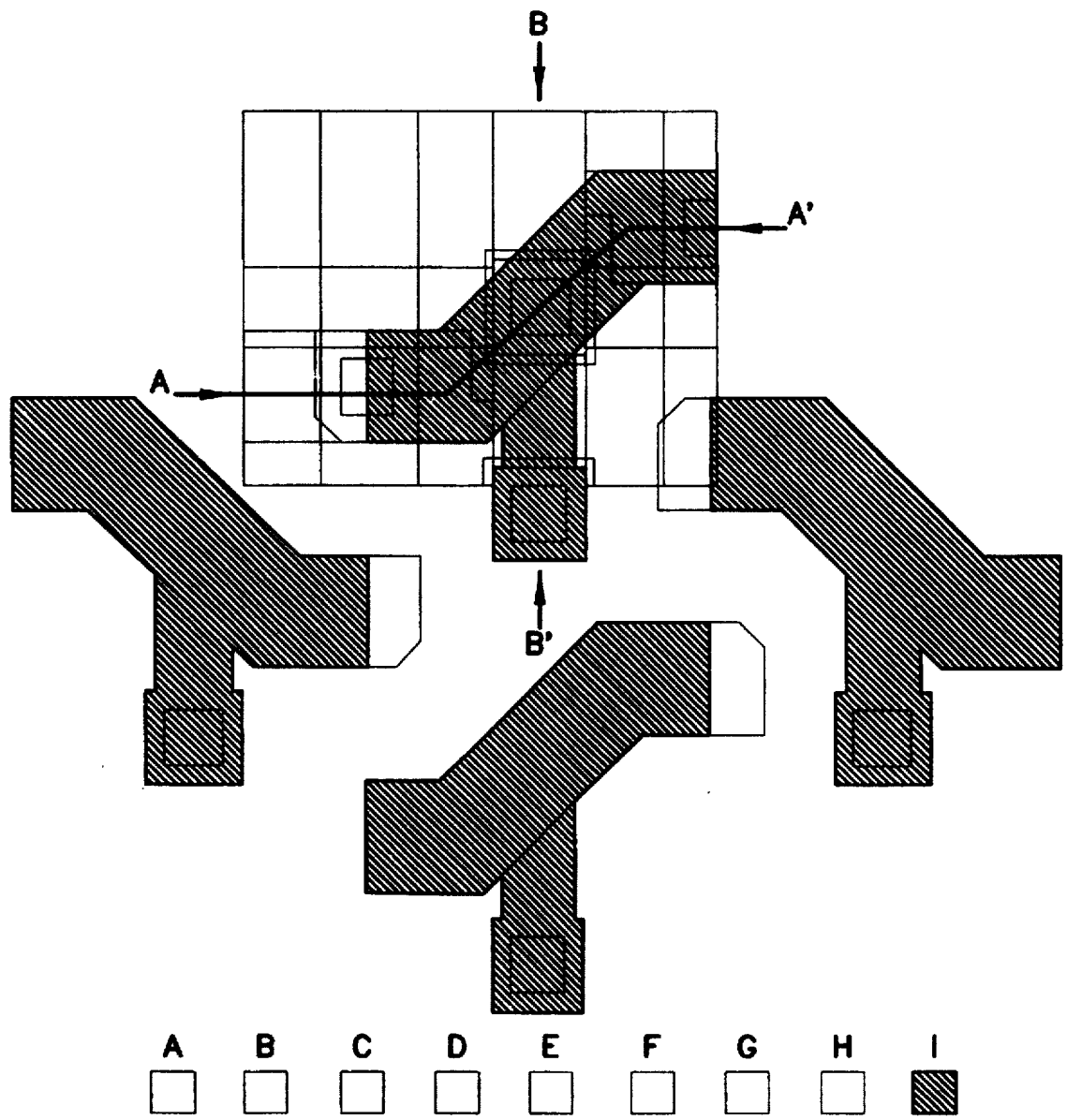

Referring to FIG. 11A–I and 1A–1I, there is illustrated a layout of masks employed for fabrication of a semiconductor device in accordance with the present invention. In FIG. 1A–I, the reference character a denotes an isolation region mask (FIG. 1A), b a gate electrode/word line mask (FIG. 1B), c a storage electrode contact hole mask (FIG. 1C), d a storage electrode mask (FIG. 1D), e a plate electrode mask (FIG. 1E), f a bit line contact hole mask (FIG. 1F), g a bit line electrode mask (FIG. 1G), h a thin film substrate contact hole mask (FIG. 1N), and i a thin film MOSFET substrate mask (FIG. 1I).

FIGS. 2A to 2F are cross-sectional views respectively taken along the line A—A' of FIG. 1A–I, illustrating a method for fabricating the semiconductor device in accordance with the present invention.

Figure 2A:
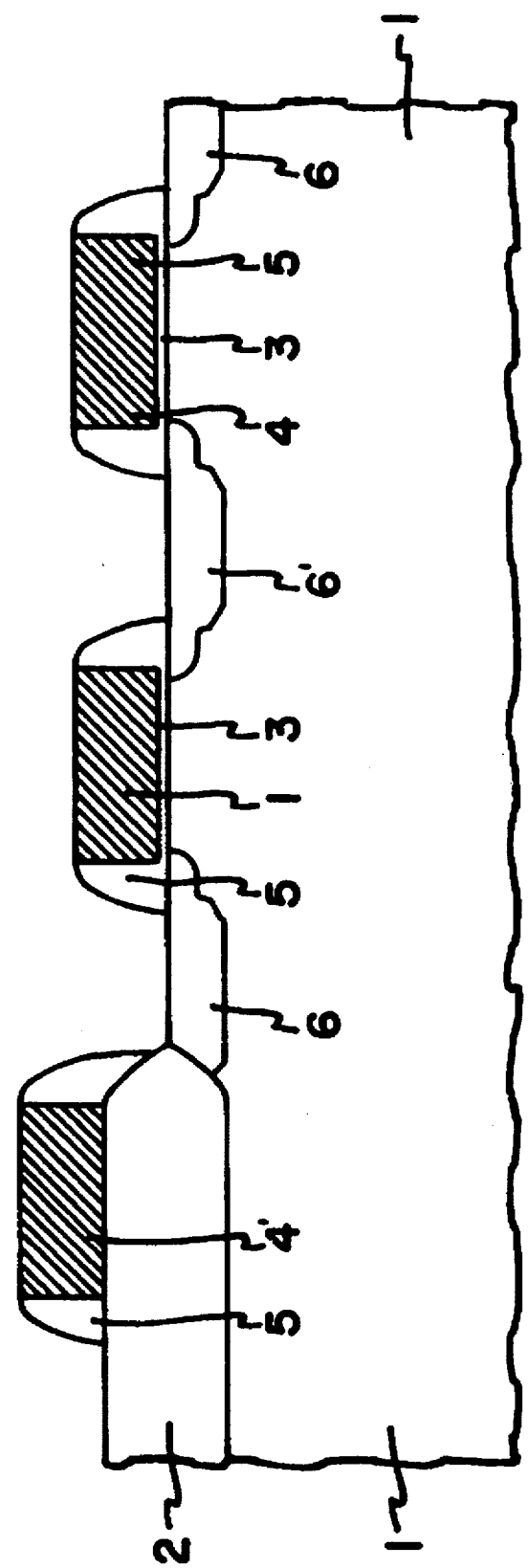

In accordance with the illustrated method, first, a field oxide film 2 is grown on a semiconductor substrate 1 formed with a P-well (or an N-well) using a local oxidation of silicon (LOCOS) process, as shown in FIG. 2A. A first gate oxide film 3 and a first polysilicon layer for gate electrode/ word line are then deposited on the semiconductor substrate 1 without any time delay. Impurity ions are then implanted in the polysilicon layer. Using the gate electrode/word line mask b, the polysilicon layer is partially etched, thereby forming a first gate electrode 4 and a word line pattern 4'. Thereafter, N type (or P type) impurity ions are implanted in a low concentration in exposed portions of the semiconductor substrate 1. A first spacer oxide film 5 is then formed on side walls of the first gate electrode 4 and word line pattern 4'. N type (or P type) impurity ions are then implanted in a high concentration in exposed portions of the semiconductor substrate 1, thereby forming a bulk MOSFET having active regions 6 and 6' of the LDD structure.

Over the entire exposed surface of the resulting structure, a first insulating film 7 is then deposited to a predetermined thickness, as shown in FIG. 2B. The first insulating film 7 is then selectively etched at its portion disposed over the source active region 6 of the bulk MOSFET using the storage electrode contact hole mask c. A second polysilicon layer having a predetermined thickness is then deposited over the entire exposed surface of the resulting structure such that it is in contact with the source active region 6. Using the storage electrode mask d, the second polysilicon layer is then patterned to form a first storage electrode 8. Thereafter, a first dielectric film 9 is formed over the first storage electrode 8. Over the entire exposed surface of the resulting structure, a third polysilicon layer is then deposited. Using the plate electrode mask e, the third polysilicon layer is then pattern to form a first plate electrode 10.

Figure 2C:
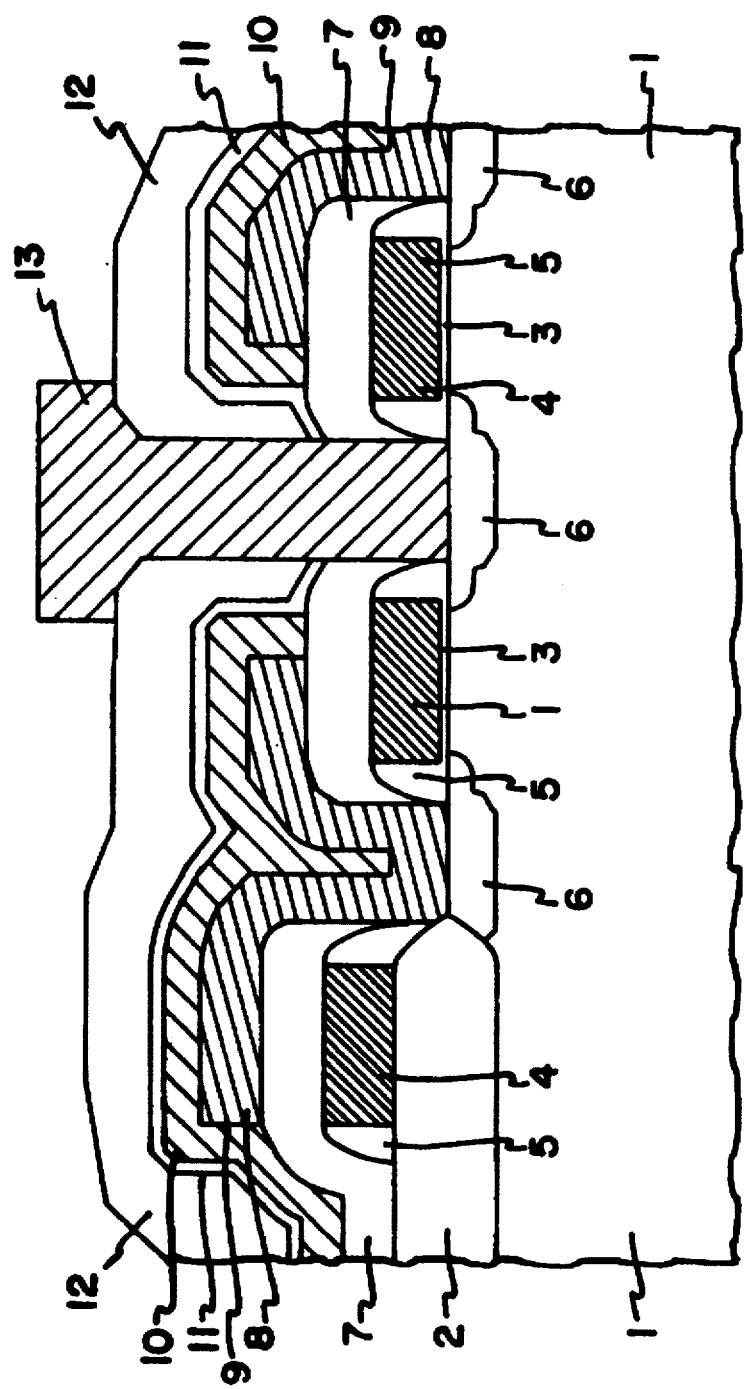

Over the entire exposed surface of the resulting structure, a second insulating film 11 having a predetermined thickness is then deposited, as shown in FIG. 2C. Thereafter, a third insulating film 12 is deposited to a predetermined thickness over the second insulating film 11. Using the bit line contact hole mask f, the third insulating film 12 and second insulating film 11 are selectively etched. Over the entire exposed surface of the resulting structure, a conduction layer is then deposited such that it is in contact with the drain active region 6' of the bulk MOSFET. Thereafter, the conduction layer is patterned using the bit line electrode mask g, thereby forming a first bit line electrode 13.

Over the entire exposed surface of the resulting structure, a fourth insulating film 14 having a predetermined thickness is then deposited, as shown in FIG. 2D. The fourth insulating film 14 is then planarized. Subsequently, the fourth insulating film 14, third insulating film 12, second insulating film 11 and first insulating film 7 are selectively etched in a sequential manner using the thin film substrate contact hole mask h, thereby forming a contact hole. Over the entire exposed surface of the resulting structure, a fourth polysilicon layer to serve as a substrate of a thin film MOSFET is then deposited such that it is in contact with the semiconductor substrate through the contact hole. The resulting structure is then subjected to a re-crystallization process or a thermal process. Using the thin film MOSFET substrate mask i, portions of the MOSFET except for a portion to be used as a substrate 15 are removed. Subsequently, a second gate oxide film 16 and a fifth polysilicon layer for gate electrode/word line are deposited on the resulting structure without any time delay. Impurity ions are then implanted in the fifth polysilicon layer. Using the gate electrode/word line mask b, the fifth polysilicon layer is partially etched, thereby forming a second gate electrode 17 and a word line pattern 17'. Thereafter, N type (or P type) impurity ions are implanted in a low concentration in exposed portions of the substrate 15. A second spacer oxide film 18 is then formed on side walls of the second gate electrode 17 and word line pattern 17'. N type (or P type) impurity ions are then implanted in a high concentration in exposed portions of the substrate 15, thereby forming a thin film MOSFET having active regions 19 and 19' of the LDD structure. Over the entire exposed surface of the resulting structure, a fifth insulating film 20 is then deposited to a predetermined thickness. The fifth insulating film 20, the active region 19' of the thin film MOSFET, the substrate 15 of the thin film MOSFET and the fourth insulating film 14 are then selectively etched in a sequential manner using the bit line contract hole mask f. A conduction layer is then deposited over the entire exposed surface of the resulting structure such that it is in contact with the first bit line electrode 13. Thereafter, the conduction layer is anisotropically etched to form a second spacer bit line electrode 21. The second bit line electrode 21 is selectively formed such that it is disposed in the interior of the contact hole while being in contact with the first bit line electrode 13.

Figure 2E:
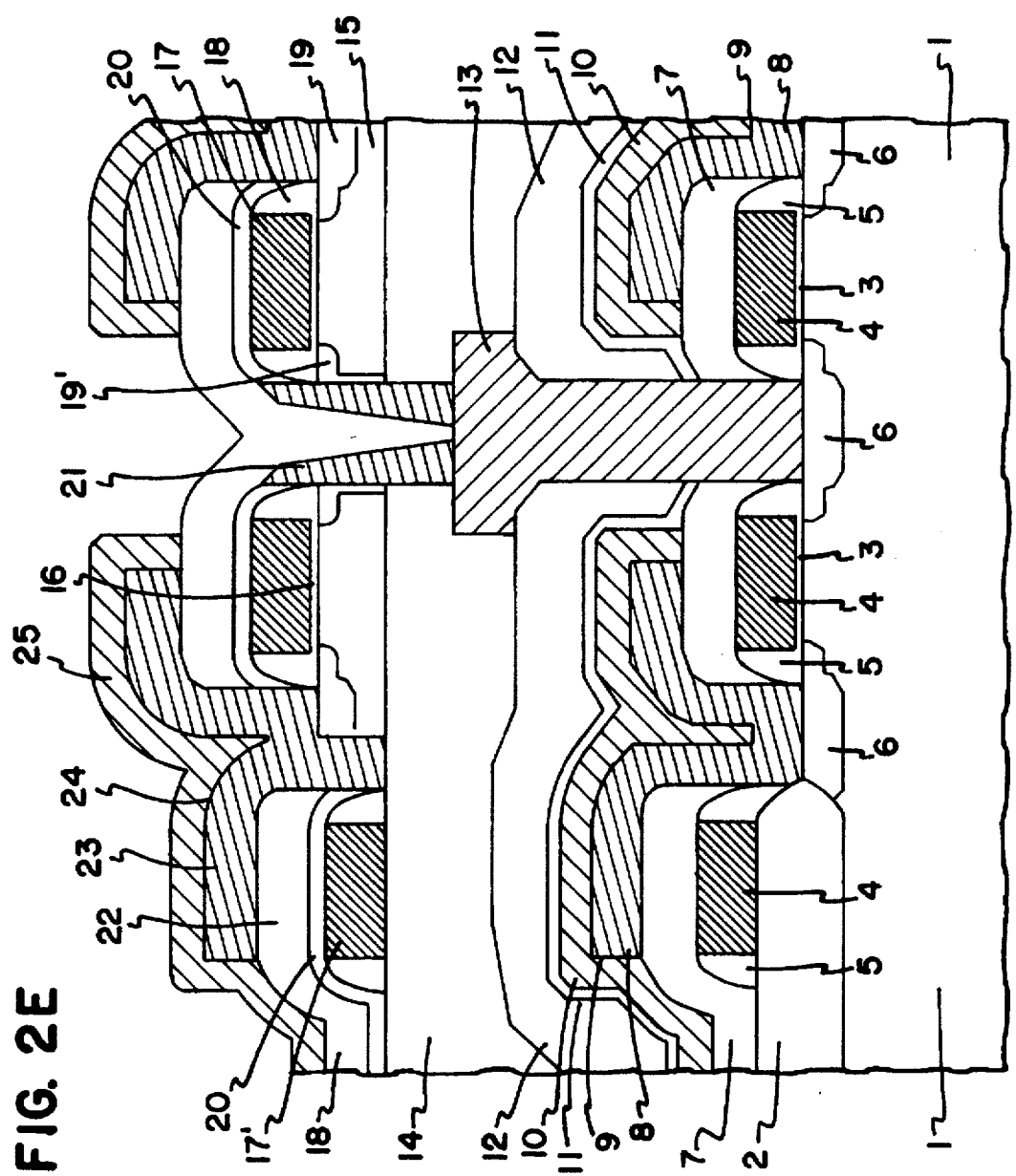
Figure 2F:
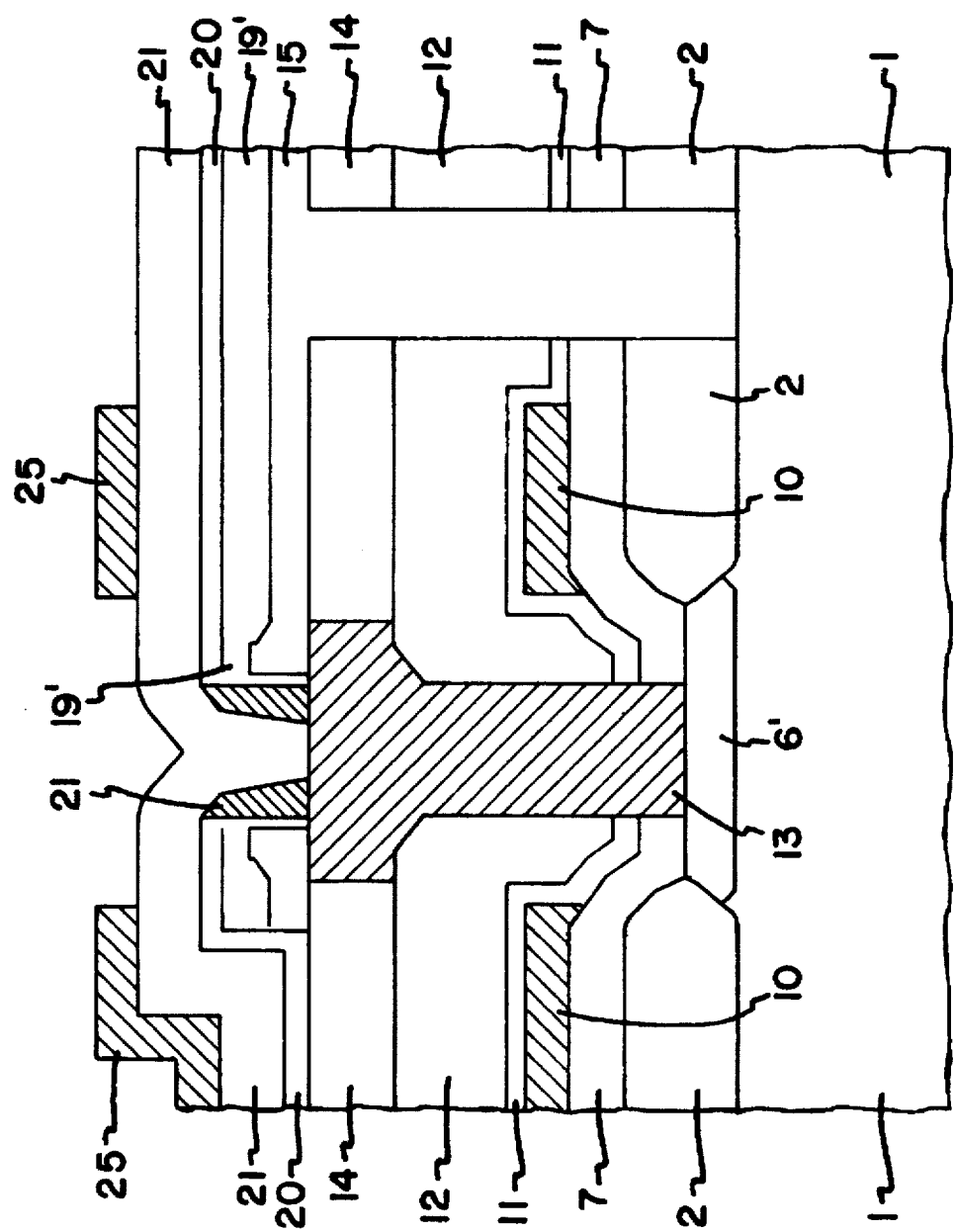
FIG. 2F is a cross-sectional view taken along the line B—B' of FIG. 1A–I, illustrating the semiconductor device fabricated in accordance with the present invention.

Subsequently, a sixth insulating film 22 having a predetermined thickness is deposited over the entire exposed surface of the resulting structure, as shown in FIG. 2E. Portions of the sixth insulating film 22 and fifth insulating film 20 disposed over the source active region 19 of the thin film MOSFET are selectively etched in a sequential manner using the storage electrode contact hole mask c. Using the storage electrode mask d, a polysilicon film is then deposited to a predetermined thickness over the entire exposed surface of the resulting structure. The polysilicon film is patterned to form a second charge storage electrode 23. Over the second charge storage electrode 23, a second-dielectric film 24 is then formed. A polysilicon film is then deposited over the second dielectric film 24. Using the plate electrode mask f, the polysilicon film deposited over the second dielectric film 24 is then patterned to form a second plate electrode 25. The resulting structure is shown in FIG. 2F which is a cross-sectional view taken along the line B—B' of FIG. 1A–I.

As apparent from the above description, the method of the present invention provides a semiconductor device with a structure having an integration degree increased by twice those of the existing structures in the same area, using existing equipments and fabrication techniques. Since the thin film substrate is in contact with the semiconductor substrate in accordance with the present invention, the characteristic of the thin film MOSFET can be adjusted using the substrate voltage so that it is equivalent to that of the bulk MOSFET. This means that the number of unit chips can be increased twice as compared with conventional cases where wafers of the same area are used. Accordingly, it is possible to reduce the fabrication cost.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device, comprising the steps of:

(a) forming a bulk metal oxide silicon field effect transistor having a first element isolation layer, a first gate electrode and a first source and drain on a semiconductor substrate;

(b) sequentially forming an insulating layer, a planarizing layer, a capacitor and a first bit line electrode layer in contact with the first source and drain over the bulk transistor;

(c) forming a planarizing layer on the resulting structure obtained at step (b) and then forming a semiconductor layer for a substrate of a thin film transistor;

(d) forming a thin film metal oxide silicon field effect transistor having a second gate electrode and a second source and drain on the semiconductor layer; and (e) forming a second bit line electrode layer on the resulting structure obtained at step (d) such that the second bit line electrode layer is in direct contact with the first bit line electrode layer as well as the second source and drain.

2. A method in accordance with claim 1, wherein the step (d) further comprises the steps of:

sequentially depositing a gate insulating layer and a polysilicon film over the semiconductor layer, and then selectively etching the polysilicon film using a gate electrode/word line mask, thereby forming the second gate electrode and a word line pattern; and implanting impurity ions first in first exposed portions of the semiconductor layer, forming insulating layer spacers on side walls of the second gate electrode and word line pattern, respectively, and implanting impurity ions in a higher concentration in second exposed portions of the semiconductor layer, thereby forming a thin film metal oxide silicon field effect transistor having a lightly doped structure.

3. A method in accordance with claim 2, wherein the step (e) further comprises the steps of:

depositing an insulating film on the resulting structure obtained at step (d);

selectively etching a portion of the insulating film disposed over the source region of the thin film transistor using a storage electrode contact hole mask;

depositing a second bit line electrode layer consisting of a conduction layer after selectively etching the insulating film such that the second bit line electrode layer is in contact with the source region.

4. A method in accordance with claim 3, wherein the second bit line electrode layer is formed using a selective growth process so that it is disposed only within a contact hole formed after selectively etching the insulating film.

5. A method in accordance with claim 4, wherein the second bit line electrode layer is formed in the form of spacers disposed in the contact hole such that it is in contact with the first bit line electrode layer.

* * * * *

UNITED STATES PATENT AND TRADEMARK OFFICE
CERTIFICATE OF CORRECTION

PATENT NO. : 5,492,851

DATED : February 20, 1996

INVENTOR(S) : Ryou

It is certified that error appears in the above-identified patent and that said Letters Patent is hereby corrected as shown below:

Title page, Item [54], & Col. 1, "ATTACHED" should read --STACKED--

Col. 2, line 45 "Fig. 11A-I and 1A-1I" should read --1A-I--

Col. 2, line 54 "(Fig. 1N)" should read --(Fig. 1H)--

Col. 5, line 10 "comprises" should read --comprising--

Col. 6, line 2 "comprises" should read --comprising--

Signed and Sealed this

Tenth Day of December, 1996

Attest:

BRUCE LEHMAN

*Attesting Officer*

*Commissioner of Patents and Trademarks*